United States Patent [19]

Nozaki

[11] Patent Number: 5,847,432
[45] Date of Patent: Dec. 8, 1998

[54] SEMICONDUCTOR DEVICE AND PRODUCTION METHOD THEREFOR

[75] Inventor: Masahiko Nozaki, Itami, Japan

[73] Assignee: Mitsubishi Denki Kabushiki Kaisha, Tokyo, Japan

[21] Appl. No.: 457,724

[22] Filed: Jun. 1, 1995

[30] Foreign Application Priority Data

Jan. 11, 1995 [JP] Japan .................................. 7-002615

[51] Int. Cl.$^6$ .......................... H01L 29/76; H01L 21/265
[52] U.S. Cl. .......................... 257/369; 257/371; 257/392; 257/402; 257/500; 437/29; 437/34; 437/44; 437/45; 437/48; 437/913
[58] Field of Search ..................... 257/392, 369, 257/371, 402, 500; 437/29, 34, 44, 45, 48, 913

[56] References Cited

U.S. PATENT DOCUMENTS 4,866,002  9/1989  Shizukuishi et al. ............... 257/392

OTHER PUBLICATIONS

A 0.6μmCMOS SOG with 5V/3.3V Interface, by Masaaki Ohkawa, Toshiro Takahashi, Mikio Yamagishi, Yasuo Sonobe, and Nobuaki Ejima, Device Development Center, Hatachi Ltd., Tokyo, Japan Aug. 1995.

Primary Examiner—Edward Wojciechowicz
Attorney, Agent, or Firm—Lowe, Price, LeBlanc & Becker

[57] ABSTRACT

A semiconductor device to which two kinds of electric voltage can be supplied comprises: a first MOS transistor formed in the first well having a first conduction type and being fixed to a first electric potential, a second MOS transistor formed in a second well having a second conduction type different from the first one and being fixed to a second electric potential higher than the first electric potential, and a third well formed between the first and second wells having the second conduction type and being fixed to a ground electric potential. The first MOS transistor comprises a first gate oxide film having a prescribed thickness and a first gate electrode having a prescribed gate length, while the second MOS transistor comprises a second gate oxide film having a thickness larger than the prescribed thickness of the first gate oxide film and a second gate electrode having a gate length longer than the prescribed thickness of the first gate length.

9 Claims, 8 Drawing Sheets

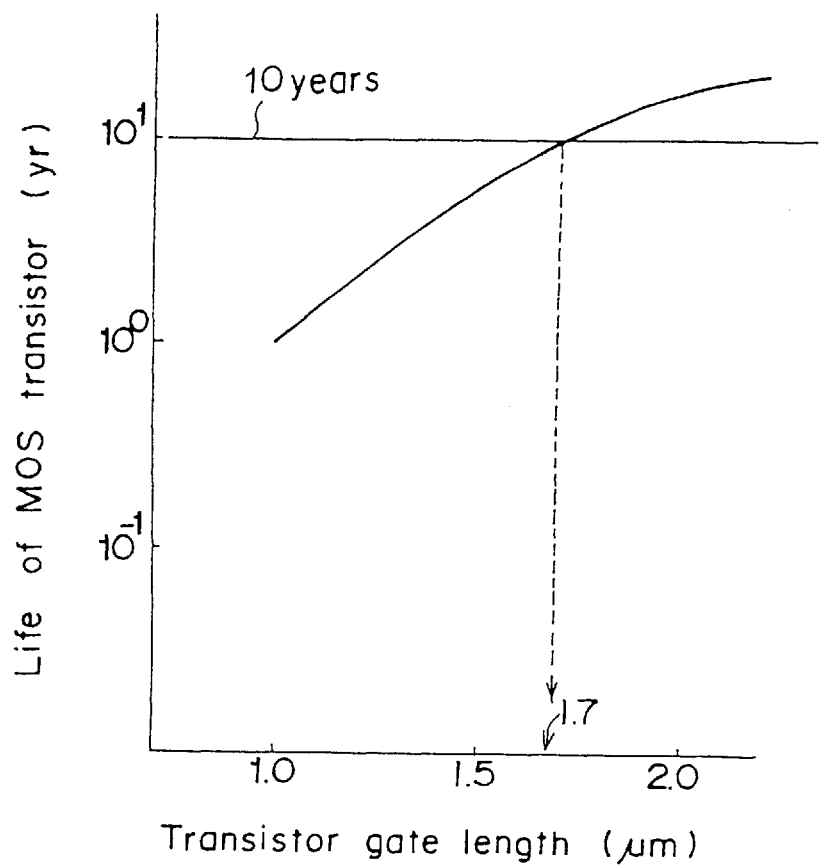

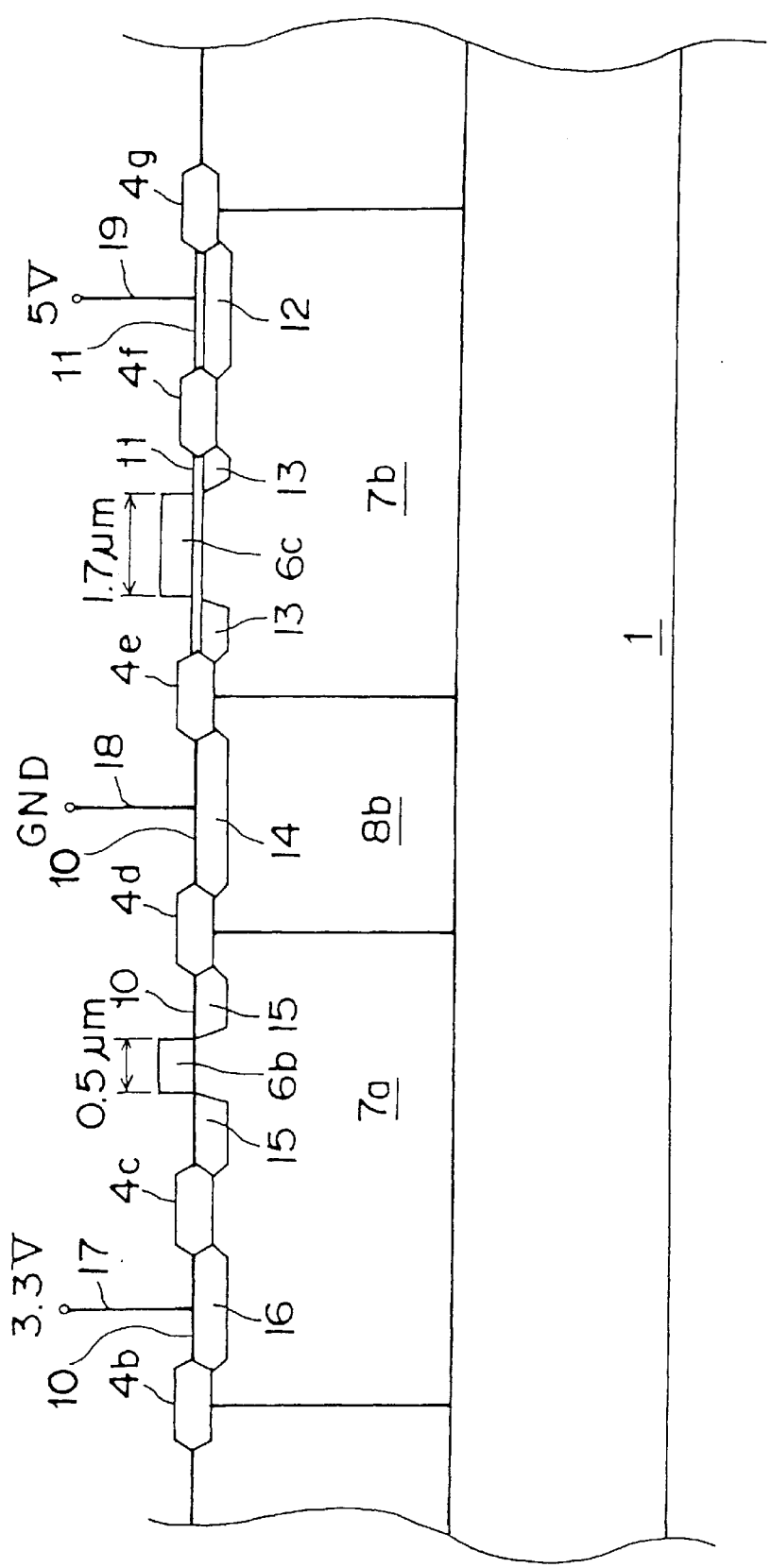

SEMICONDUCTOR DEVICE AND PRODUCTION METHOD THEREFOR

BACKGROUND OF THE INVENTION

1. Field of the Invention

The present invention relates to a semiconductor device including metal-oxide-semiconductor (MOS) transistors to which two power supply voltages can be applied.

2. Description of the Prior Art

Semiconductor devices including MOS transistors having 0.6 μm of gate length of gate electrode are mainly driven by an electric power supply of 5 volts. The semiconductor devices driven by a power source of 5 volts are optimized for a power source of 5 volts on the performance and reliability thereof.

Recently, there is a tendency that semiconductor devices having 0.5 μm of gate length are used mainly. Then, it is required to use an electric power supply of 3.3 volts for such semiconductor devices in order to guarantee reliability thereof.

On the other hand, in such a transition stage, there is also a strong demand that semiconductor devices having 0.5 μm of gate length can be used in the same system mixed with semiconductor devices having 0.6 μm of gate length and driven by a power source of 5 volts. Then, it becomes necessary to provide a semiconductor device to which two electric power supply voltages can be supplied.

However, as mentioned above, semiconductor devices driven by a power source of 5 volts are optimized for a power source of 5 volts on the performance and reliability thereof. Therefore, if 3.3 volts of power supply voltage is also supplied to the semiconductor devices, a driving current for MOS transistors included in the devices decreases to cause a problem that a driving frequency thereof decreases.

On the other hand, if 5 volts of electric voltage is supplied to a semiconductor device optimized for a power supply of 3.3 volts, the reliability worsens largely due to hot carrier injection or breakdown of gate oxide films in the MOS transistors. This is explained as follows: A saturation current of a MOS transistor is inversely proportional to a thickness of gate oxide film, while it is desirable that the saturation current is high for a high speed device. When an electric voltage of power supply decreases from 5 to 3.3 volts for a semiconductor device of 0.5 μm gate length, it is required in order to increase the saturation current to decrease a resistance at the gate oxide film or to decrease a thickness of the gate oxide film as much as possible. On the other hand, if the thickness of the gate oxide film becomes too thin, it is destroyed in a short time by the power supply voltage. A criterion on the reliability of a semiconductor device is that the performance thereof is maintained for ten years. For example, a semiconductor device having 0.5 μm gate length optimized for 3.3 volts of power supply voltage has 85 Å of thickness of gate oxide films of MOS transistors. However, if 5 volts of power supply voltage is supplied to the semiconductor device having 85 Å of thickness of gate oxide films, the device cannot be used for ten years due to hot carrier injection. Therefore, it is desirable that a semiconductor device is optimized for 3.3 volts of lower power supply voltage while it also has regions in correspondence to 5 volts of higher power supply voltage to be operated reliably. Further, it is also needed to improve latch up immunity which is caused by a pass current between regions for higher power supply voltage and those for lower power supply voltage.

SUMMARY OF THE INVENTION

An object of the present invention is to provide an semiconductor device to which two kinds of electric voltage can be supplied reliably.

In a semiconductor device according to the present invention, a twin well structure including first to third well is formed. In a first well having a first conduction type and being fixed to a first voltage, a first MOS transistor is formed so as to have a first gate oxide film having a prescribed thickness and a first gate electrode having a prescribed gate length optimized for the first voltage. On the other hand, in a second well having the first conduction type and being fixed to a second voltage higher than the first voltage, a second MOS transistor is formed so as to have a second gate oxide film having a second thickness larger than that of the first gate oxide film and a second gate electrode having a second gate length longer than the first gate length. The third well provided between the first and second wells has a second conduction type opposite to the first conduction type and being fixed to a ground potential. For example, the first and second wells are N wells, and the third well is a P well, while the first and second MOS transistors are N-channel MOS transistors, and vice versa. For example, the first and second voltages are 3.3 and 5 volts, the thicknesses of the first and second gate oxide films are 85 and 150 Å, and the first and second gate lengths are 0.5 and 1.7 μm.

An advantage of the present invention is to provide a semiconductor device which can operate with sufficient reliability even if one of high and low power supply voltages is applied thereto while improving latch up immunity.

BRIEF DESCRIPTION OF THE DRAWINGS

These and other objects and features of the present invention will become clear from the following description taken in conjunction with the preferred embodiments thereof with reference to the accompanying drawings, and in which:

FIG. 3 is a graph of a logarithm of a life (failure rate) of a gate oxide film having a thickness of 150 Å plotted against gate length of gate electrode of MOS transistor;

FIG. 4 is a schematic sectional view of an N channel transistor as a part in a CMOS transistor structure;

DETAILED DESCRIPTION OF THE PREFERRED EMBODIMENTS

Figure 1:
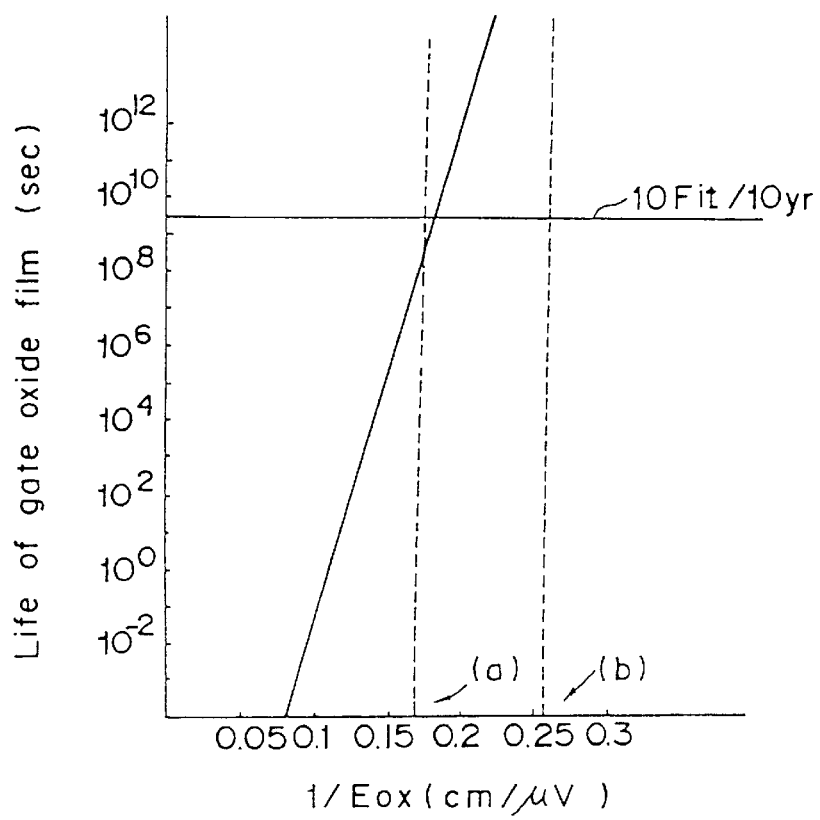
FIG. 1 is a graph of a logarithm of a life (failure rate) of a gate oxide film having a thickness of 85 Å plotted against an inverse of power supply voltage $E_{ox}$ supplied to a MOS transistor including the gate oxide film.

Referring now to the drawings, wherein like reference characters designate like or corresponding parts throughout the several views, embodiments of the invention are explained. A semiconductor device of an embodiment is a semiconductor integrated circuit comprising CMOS transistors, and a CMOS transistor comprises a N-channel MOS transistor and a P-channel MOS transistor. Each of N-channel and P-channel MOS transistors includes a MOS transistor including a gate oxide film having a prescribed thickness and a gate electrode having a prescribed gate length suitable for supplying a lower power supply voltage or 3.3 volts and a second MOS transistor including a gate oxide film having a thickness larger than the prescribed thickness and a gate electrode having a gate length longer than the prescribed gate length suitable for supplying a higher power supply voltage or 5 volts. Therefore, the device can be used with a particular power supply for supplying either of an electric voltage of 3.3 or 5 volts. Further, in order to improve latch up immunity, a well having a conduction type different from the MOS transistors is provided between the MOS transistors, and the potential of the well is fixed to the ground.

As stated above, a gate oxide film of the first MDS transistor has a prescribed thickness smaller than that of the second MOS transistor, and a gate electrode of the first MOS transistor has a prescribed gate length shorter than that of the second MOS transistor. The thickness of the gate oxide film is explained first. A saturation current of a MOS transistor is inversely proportional to a thickness of a gate oxide film, and it is desirable that the saturation current is high for a high speed device. On the other hand, if the thickness of the gate oxide film becomes too thin, it is destroyed in a short time by the power supply voltage. In the embodiment, the thickness of the gate oxide film is set to be 85 Å for the first MOS transistor to which 3.3 volts of power supply voltage is applied. The thickness is optimized for a power source of 3.3 volts on the performance and reliability, and, as explained below with reference to FIG. 1, such first MOS transistor can satisfy the criterion of 10 Fit/10 years.

The thickness of the gate oxide film is explained further with reference to failure rate, FIG. 1 shows a graph of a logarithm of a life (failure rate) of a gate oxide film having a thickness of 85 Å in the unit of second plotted against an inverse of power supply voltage $E_{ox}$ in the unit of cm/μV. A solid linear line shows the relation. A solid horizontal line shows a criterion of 10 Fit (failure bits)/10 years, while points "a" and "b" represent $1/E_{ox}$ for 5 volts and for 3.3 volts of $E_{ox}$. It is apparent that if $E_{ox}$ is 3.3 volts, the failure rate satisfies the criterion of 10 Fit/10 year, or the gate oxide film of 85 Å of thickness can maintain its performance for ten years for a power supply voltage of 3.3 volts. On the contrary, the gate oxide film can not maintain its performance for ten years for a power supply voltage of 5 volts. In other words, if 5 volts is supplied to the MOS transistor optimized for 3.3 volts of power supply voltage, the life thereof does not extend to ten years because hot carrier injection increases.

Figure 2:
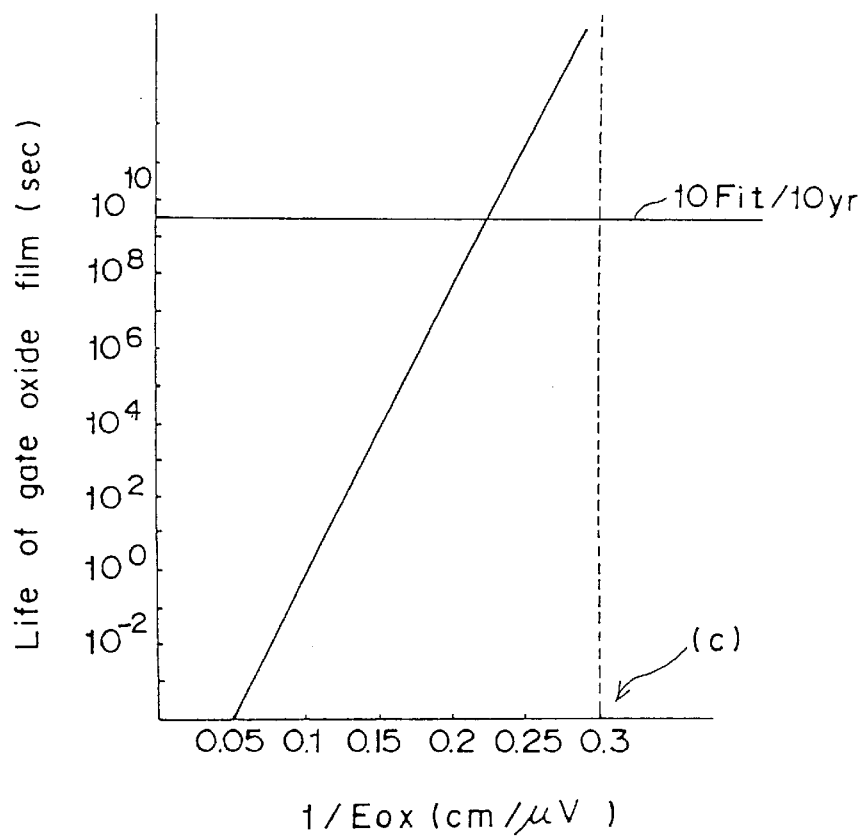
FIG. 2 is a graph of a logarithm of a life (failure rate) of a gate oxide film having a thickness of 150 Å plotted against an inverse of power supply voltage $E_{ox}$ supplied to a MOS transistor including the gate oxide film.

Then, the thickness of the gate oxide film is set to be 150 Å for the second MOS transistor to which 5 volts of power supply voltage is applied. This thickness 150 Å for the second MOS transistor is set to be larger than 85 Å for the first one. Thus, such second MOS transistor can also satisfy the criterion of 10 Fit/10 year. This is explained with reference to FIG. 2 on another graph on life (failure rate) of the gate oxide film, wherein the thickness of the gate oxide film is 150 Å. A point "c" represents $1/E_{ox}$ for 5 volts. The graph shows that if the thickness of the gate oxide film is 150 Å and $E_{ox}$ is 5 volts, the failure rate satisfies the criterion of 10 Fit/10 year. This means that a gate oxide film of 150 Å of thickness can maintain its performance for ten years for power supply voltage of 5 volts.

Next, the gate length of gate electrode is explained. The gate length of the first MOS transistor to which 3.3 volts of power supply voltage is applied is set to be 0.5 μm. This value is optimized for a power source of 3.3 volts on the performance and reliability. On the other hand, if the gate length is adopted also for the second MOS transistor in the high voltage region, the criterion cannot be satisfied due to generation of hot carriers. FIG. 3 shows a graph of a logarithm of life of MOS transistor in the unit of year plotted against gate length in the unit of μm for a MOS transistor having a gate oxide film of thickness of 150 Å and optimized for 3.3 volts of power supply voltage. This graph shows that if the gate length is 1.7 μm or longer, the life exceeds ten years. Then, the gate length of the second MOS transistor to which 5 volts of power supply voltage is applied is set to be 1.7 μm longer than 0.5 μm for the first MOS transistor.

As explained above with reference to FIGS. 1–3, in order to supply 5 volts of power supply voltage to a MOS transistor in a high voltage region, the transistor is needed to have a larger thickness of gate oxide film and a longer gate length of gate electrode.

To sum up, a semiconductor device including MOS transistors of the embodiment comprises a first MOS transistor formed in a first well for lower power supply voltage, and a second MOS transistor formed in a second well for a high power supply voltage. The first MOS transistor includes a gate oxide film having a prescribed thickness and a gate electrode having a prescribed gate length optimized for a first electric voltage or 3.3 volts of power supply voltage, while the second MOS transistor includes a gate oxide film having a thickness larger than the prescribed thickness and a gate electrode having a gate length longer than the prescribed gate length in order to guarantee the reliability for a second electric voltage or 5 volts of power supply voltage by preventing generation of hot carriers and breakdown of the gate oxide film. Thus, the semiconductor device can be operated with sufficient reliability when either of two power supply voltages is supplied. Further, a third well having a conduction type different from the MOS transistors is provided between the two different MOS transistors, and the potential of the well is fixed to the ground. Thus, the first well fixed to a first potential is separated by the third well from the second well fixed to a second potential higher than the first one, and latch up immunity is improved by preventing a flow of pass current from the second well to the first one.

Next, a structure of an embodiment of a semiconductor device is explained in detail. As mentioned above, the semiconductor device comprises CMOS transistors, and each CMOS, transistor comprises an N-channel MOS transistor and P-channel MOS transistors. FIG. 4 shows an P-channel transistor, and it has a first MOS transistor in a low voltage region for 3.3 volts of power supply voltage at the left side and a second MOS transistor in a high voltage region for 5 volts of power supply voltage at the right side. Two N wells 7a and 7b and a P well 8b are formed in a silicon substrate 1. The two N wells 7a and 7b are provided to form P-channel MOS transistors. The P well 8b has a conduction type different from that of the N wells 7a and 7b, and an electric potential thereof is fixed to the ground.

Islands 4b, 4c, 4d, 4e, 4f and 4g are formed on the wells 7a, 8b and 7b for isolating elements. An oxide film 10 is formed in a field area on the N well 7a and the P well 8b, and its thickness is 85 Å. A gate electrode 6b is formed on the gate oxide film 10 between the islands 4c and 4d, and two P⁺ diffusion layers 15 for drain and source electrodes are formed below the film 10 between the island 4c and the gate electrode 6b and between the gate electrode 6b and the island 4d, respectively. The gate electrode 6b has a gate length of 0.5 μm, as mentioned above. Further, an N⁺ diffusion layer 16 is formed between the islands 4b and 4c on the N well 7a, and an electrode terminal 17 for supplying 3.3 volts is provided to be connected to the $N^+$ diffusion layer 16. Thus, the N well 7a is fixed to 3.3 volts.

A $P^+$ diffusion layer 14 is formed between the islands 4d and 4e in the P well 8b, and an electrode terminal 18 is provided above the $P^+$ diffusion layer 14 to be connected to the ground. Thus, the P well 8b is fixed to the ground. Then, reverse bias voltage is provided between the P well 8b and the N well 7a and between the P well 8b and the N well 7b, and the N well 7a and 7b can be isolated electrically from each other. (This structure is called as twin-well structure.)

Similarly to the case of the N well 7a, an oxide film 11 is formed in a field area on the N well 7b, and its thickness is 150 Å. A gate electrode 6c is formed on the gate oxide film 11 between the islands 4e and 4f, while two $P^+$ diffusion layers 13 for drain and source electrodes are formed below the oxide film 11 between the island 4e and the gate electrode 6c and between the gate electrode 6c and the island 4f, respectively. The gate electrode 6c has a gate length of 1.7 μm, as mentioned above. Further, an $N^+$ diffusion layer 12 is formed between the islands 4f and 4g in the N well 7b, and an electrode terminal 19 to be connected to 5 volts of power supply voltage is provided above the $N^+$ diffusion layer 12. Thus, the N well 7b is fixed to 5 volts.

As explained above, the first MOS transistor of the P-channel MOS transistor is formed in the first N well 7a, and the second MOS transistor of the P-channel MOS transistor is formed in the second N well 7b. The first MOS transistor includes the gate oxide film 10 having a thickness of 85 Å and the gate electrode 6b having a gate length of 0.5 μm optimized for 3.3 volts of power supply voltage, while the second MOS transistor includes the gate oxide film 11 having a thickness of 150 Å and the gate electrode 6c having a gate length of 1.7 μm in order to guarantee the reliability when used for 5 volts of power supply voltage. Thus, the semiconductor device can be operated with sufficient reliability when power supply voltage of 3.3 volts or 5 volts is supplied to the electrode 17 or 19. Further, the P well 8b is provided between the two MOS transistors, and the potential of the well is fixed to the ground. Thus, the first well 7a is fixed to 3.3 volts and the second well 7b is fixed to 5 volts higher than 3.3 volts, while the latch up immunity is improved.

Figure 5A:
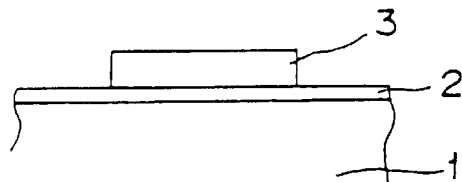
FIGS. 5A, 5B, 5C, 5D, 5E, 5F, 5G, 5H, 5I, 5J, 5K, 5L and 5M are schematic sectional views at various steps of producing a semiconductor device shown in FIG. 4.
Figure 5B:
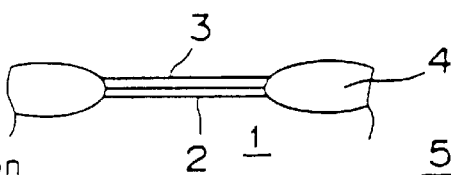
Figure 5C:
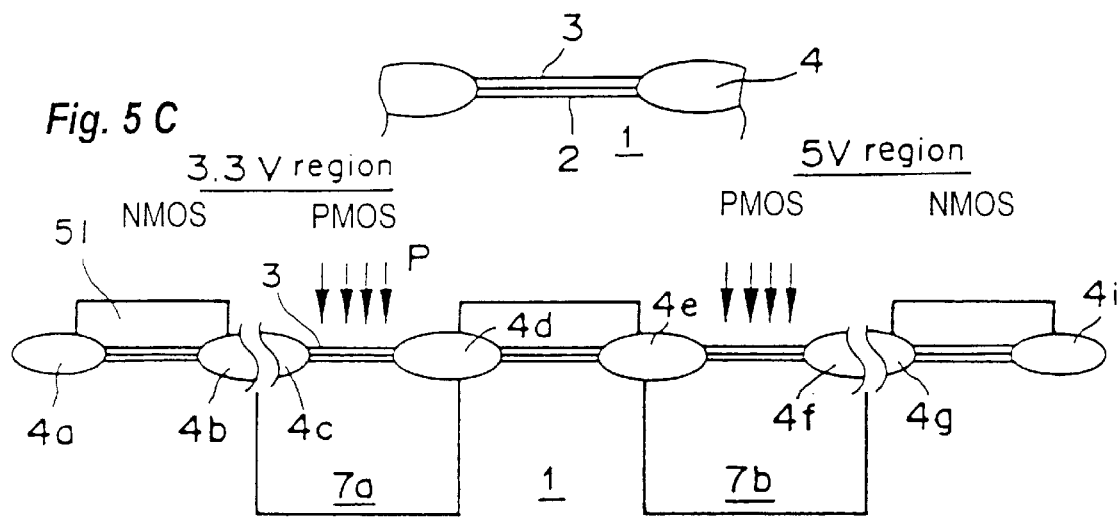
Figure 5D:
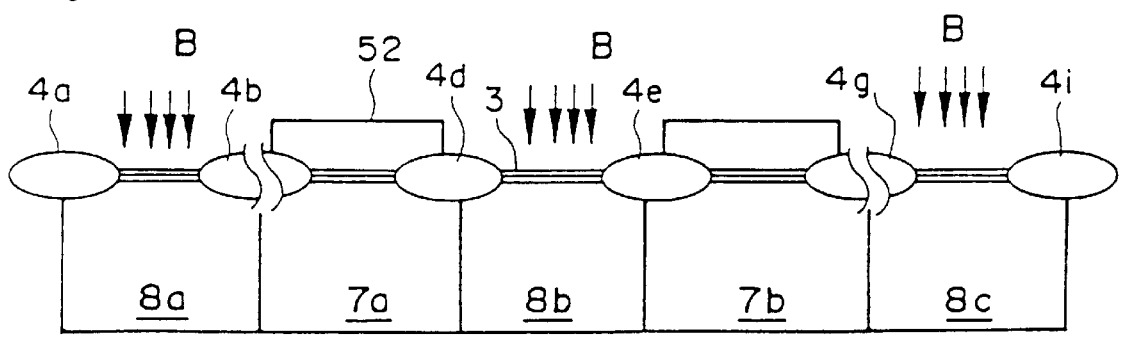
Figure 5:
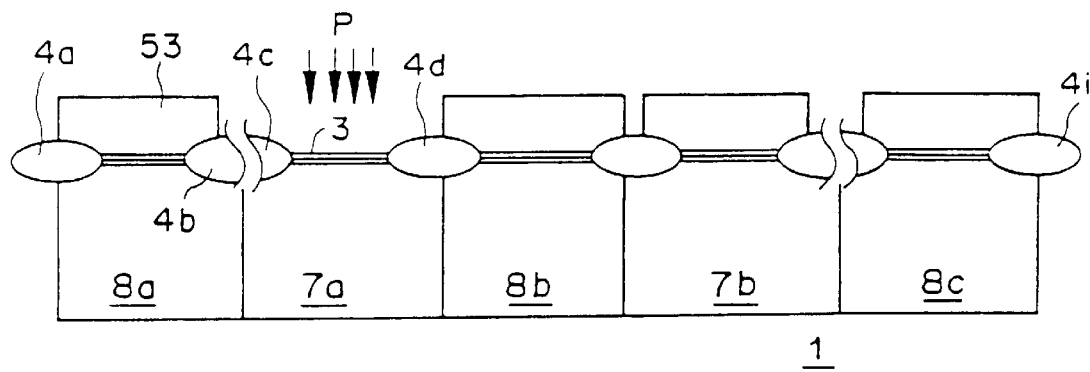
Figure 5:
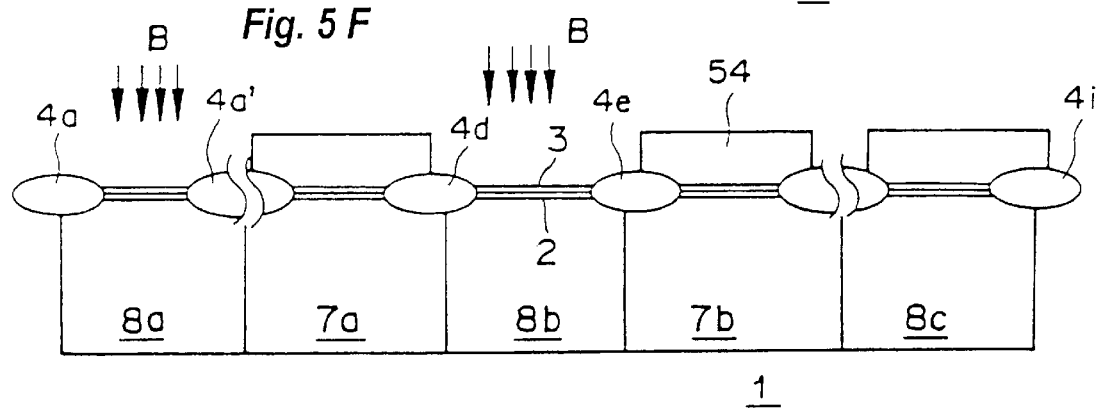
Figure 5:
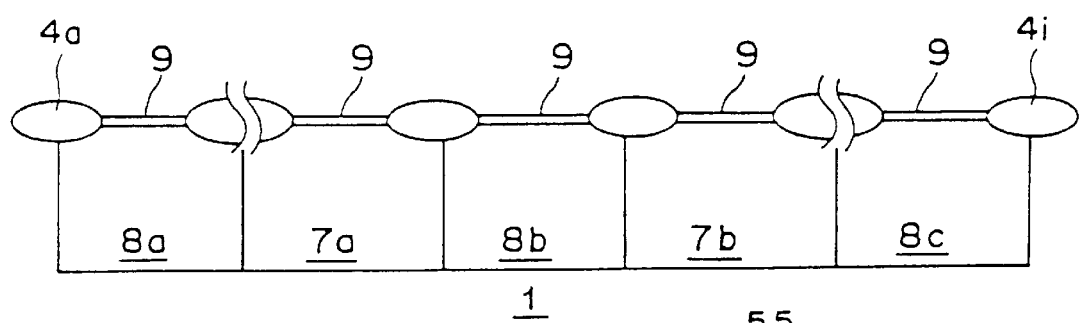
Figure 5:
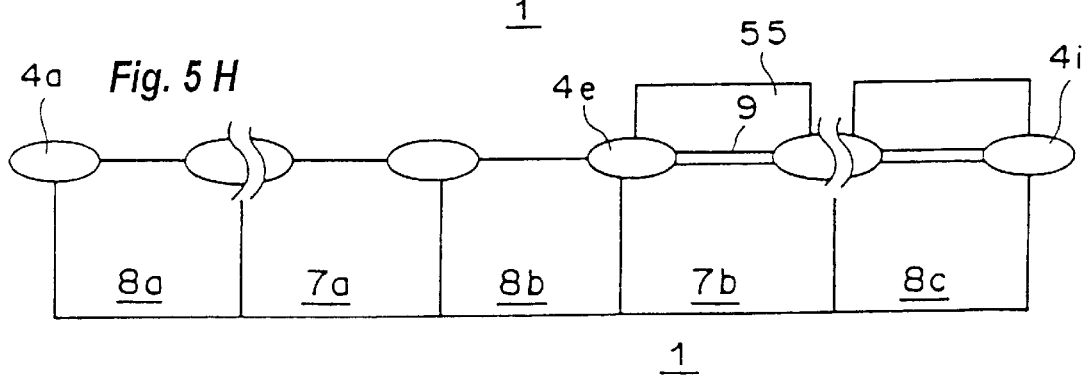
Figure 5:
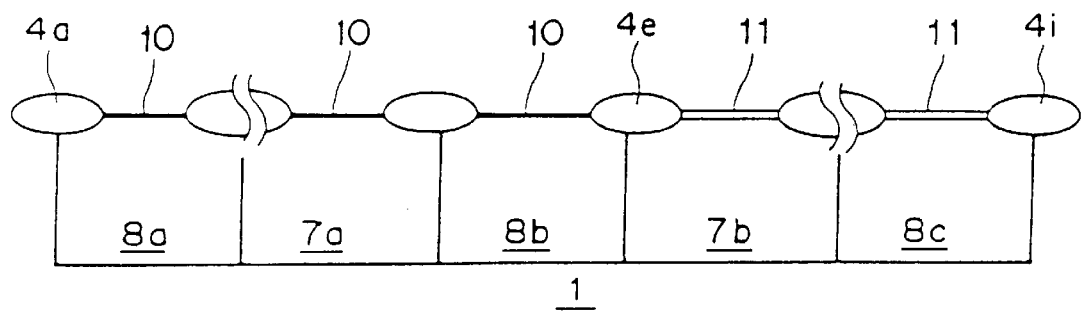
Figure 5:
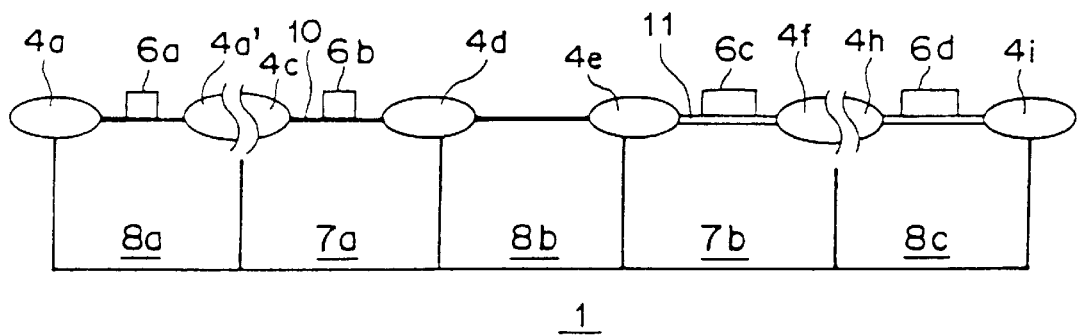
Figure 5:
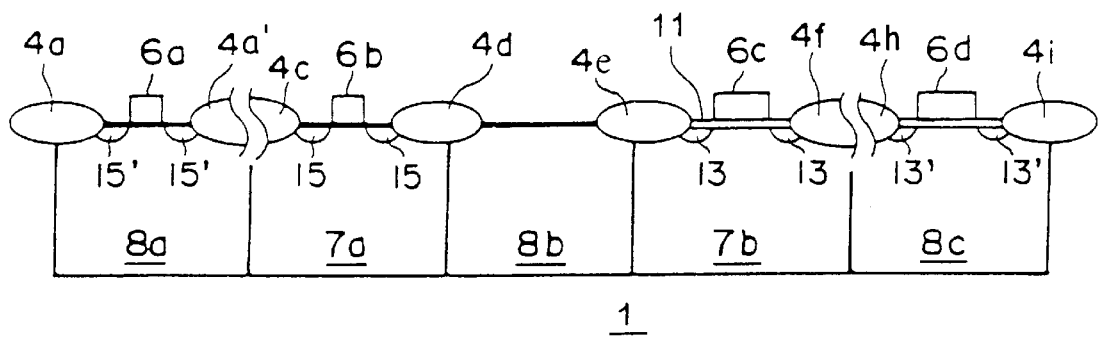
Figure 5:
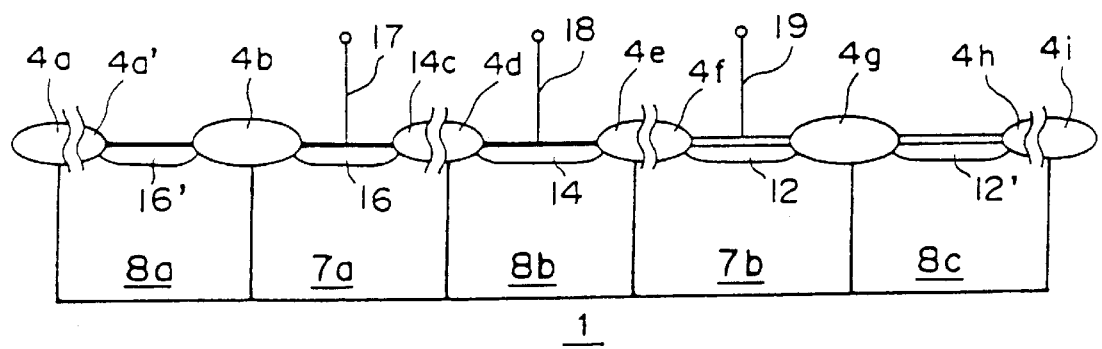

Though FIG. 4 shows only the N-channel transistor of a CMOS transistor, the P-channel transistor thereof adjacent to the N-channel transistor has a similar structure to the N-channel transistor as shown in FIG. 5, so as to form the CMOS transistor as a combination of the N- and P-channel MOS transistors.

The P-channel transistor shown in FIG. 5 has a first MOS transistor in a low voltage region for 3.3 volts of power supply voltage at the right side and a second MOS transistor in a high voltage region for 5 volts of power supply voltage at the left side. Two P wells 8c and 8d and an N well 7c are formed in the silicon substrate 1. The two P wells 7a and 7b are provided to form N-channel MOS transistors. An electric potential of The N well 7c is fixed to the ground.

Islands 4g, 4h, 4i, 4j, 4k and 4l isolate element formed on the wells 8c, 7c and 8d. The above-mentioned oxide film 10 is also formed in a field area on the N well 7c and the P well 8d, and its thickness is 85 Å. A gate electrode 6e having a gate length of 0.5 μm is also formed on the gate oxide film 10 between the islands 4j and 4k, and two $N^+$ diffusion layers 15' for drain and source electrodes are formed below the film 10 between the island 4j and the gate electrode 6e and between the gate electrode 6e and the island 4k, respectively. Further, a $P^+$ diffusion layer 16' is formed between the islands 4k and 4l on the P well 8d, and an electrode terminal 17 for supplying 3.3 volts is provided to be connected to the $P^+$ diffusion layer 16' to fix the P well 8d to 3.3 volts.

An $N^+$ diffusion layer 14' is formed between the islands 4i and 4j in the N well 7c, and an electrode terminal 18 is provided above the $N^+$ diffusion layer 14' to be connected to the ground. Thus, the P well 7c is fixed to the ground. Then, reverse bias voltage is provided between the N well 7c and the P well 8c and between the N well 7c and the P well 8d, and the P well 8c and 8d can be isolated electrically from each other. (This structure is called as twin-well structure.) The above-mentioned oxide film 11 having a thickness of 150 Åis formed in a field area on the P well 8c. The gate electrode 6d having a gate length of 1.7 μm is also formed on the gate oxide film 11 between the islands 4h and 4i, while two $N^+$ diffusion layers 13' for drain and source electrodes are formed below the oxide film 11 between the island 4h and the gate electrode 6d and between the gate electrode 6d and the island 4i, respectively. Further, a $P^+$ diffusion layer 12' is formed between the islands 4g and 4h in the P well 8c, and an electrode terminal 19 to be connected to 5 volts of power supply voltage is provided above the $P^+$ diffusion layer 12' to fix the P well 8c to 5 volts.

As explained above, the first MOS transistor of the P-channel MOS transistor is formed in the first P well 8c, and the second MOS transistor of the P-channel MOS transistor is formed in the second P well 8d. Similarly to the N-channel transistor part shown in FIG. 4, the semiconductor device can be operated with sufficient reliability when power supply voltage of 3.3 volts or 5 volts is supplied to the electrode 17 or 19. Further, the N well 7c fixed to the ground is provided between the two MOS transistors to improve the latch up immunity.

Next, a process for producing the semiconductor device shown in FIG. 4 is explained with reference to FIGS. 5A–5M. N- and P-channel MOS transistors formed in low voltage regions to which 3.3 volts of power supply voltage is applied are called as N- and P-channel MOS transistors in low voltage regions, while the counterparts formed in high voltage regions to which 5 volts of power supply voltage is applied are called as N-channel and P-channel MOS transistors in high voltage regions. It is to be noted that the P-channel MOS transistor shown in FIG. 4 is shown at the center in FIGS. 5C –5J, while two adjacent wells 8a, 8c are also displayed at the left and right sides both for adjacent N-channel MOS transistors. The left well 8a belongs to a N-channel MODS transistor in a low voltage region, while the right well 13c belongs to a N-channel MOS transistor in a high voltage region.

In the process for producing the semiconductor device, first, as shown in FIG. 5A, an oxide film 2 is formed on a silicon substrate 1, and nitride films 3 are formed on the oxide film 2 for protecting the oxidation thereof. Then, as shown in FIG. 5B, thick field oxide films 4 are formed in field regions with LOCOS oxidation process and thermal oxidization. The field oxide films 4 correspond to islands 4a–4i shown in FIG. 5C. Though not shown explicitly, islands 4a' and 4h are formed between the islands 4a and 4b and between 4g and 4i. Oxide films do not grow in regions not covered by the nitride films 3.

Then, as shown in FIG. 5C, nitride films 3 except regions for forming N wells are masked with photoresist masks 51. Next, an N-well 7a in a low voltage region and an N-well 7b in a high voltage region are formed by injecting phosphor ions into a region between the islands 4c and 4d and between the islands 4e and 4f under a high acceleration voltage. Then, the masks 51 are removed.

Next, as shown in FIG. 5D, the regions on the N-wells are first masked by photoresist masks 52, and P-wells 8a, 8b and 8c are formed by ion injection with boron ions. Then, the masks 52 are removed. The P-well 8b is provided to isolate N-wells 7a and 7b in the low and high voltage regions. The P-wells 8a and 8c are provided for adjacent P-channel MOS transistors in the low and high voltage regions, respectively. The P-well 8b makes a twin-well structure, and the MOS transistor to be formed in the N-well 7a is isolated electrically from that to be formed in the N-well 7b.

A threshold voltage $V_{TH}$ for the N- and P-channel MOS transistors in the high voltage region is determined in the above-mentioned processes. On the other hand, the N- and P-channel MOS transistors in the low voltage region have a thickness of oxide film smaller than those in the high voltage region. Therefore, further ion injection is needed to realize a threshold voltage $V_{TH}$ equal to that in the low voltage region. As shown in FIG. 6E, wells to which ions are not to be injected further are masked by photoresist masks 53, and phosphor ions are injected into the N-well 7a for the P-channel MOS transistor in the low voltage region. Then, the masks 53 are removed.

Further, as shown in FIG. 5F, other wells to which ions are not to be injected are masked by photoresist masks 54, and boron ions are injected into the P-wells 8a and 8b for the N-channel MOS transistors in the low voltage region. Then, the masks 54 are removed. Thus, a threshold voltage $V_{TH}$ for the N- and P-channel MOS transistors in the low voltage region is determined.

Next, as shown in FIG. 5G, the nitride films 3 and the oxide films 2 are removed, and oxide films 9 of thickness of 130 Å are formed by a first oxidation process. Then, as shown in FIG. 5H, photoresist masks 55 are formed on the wells for MOS transistors in the high voltage region, and the oxide films 9 not masked are removed.

Next, as shown in FIG. 5I, the photoresist masks 55 are removed, and a second oxidation process is performed to form gate oxide films 10 of thickness of 85 Å and gate oxide films 11 of thickness of 150 Å are formed. The thickness of the oxide films 9 are determined experimentally to form the gate oxide films 11 of thickness of 150 Å in the second oxidation process.

Next, a layer made of a material for gate electrodes is formed, and as shown in FIG. 5J, gate electrodes 5a–5d are formed by using a lithography process and an etching process for the gate electrodes. The gate length of the gate electrodes 6a and 6b in the low voltage region is set to be 0.5 $\mu$m, while that of the gate electrodes 6c and 6d in the high voltage region is set to be 1.7 $\mu$m.

Next, as shown in FIG. 5K, $N^{30}$ and $P^+$ diffusion layers 15' and 15 are formed between the islands 4a and 4b between the islands 4c and 4d, while $P^+$ diffusion layers 13 and 13' are formed between the islands 4e and 4f and between the islands 4g and 4h with a known diffusion process for source and drain electrodes.

Figure 5M:
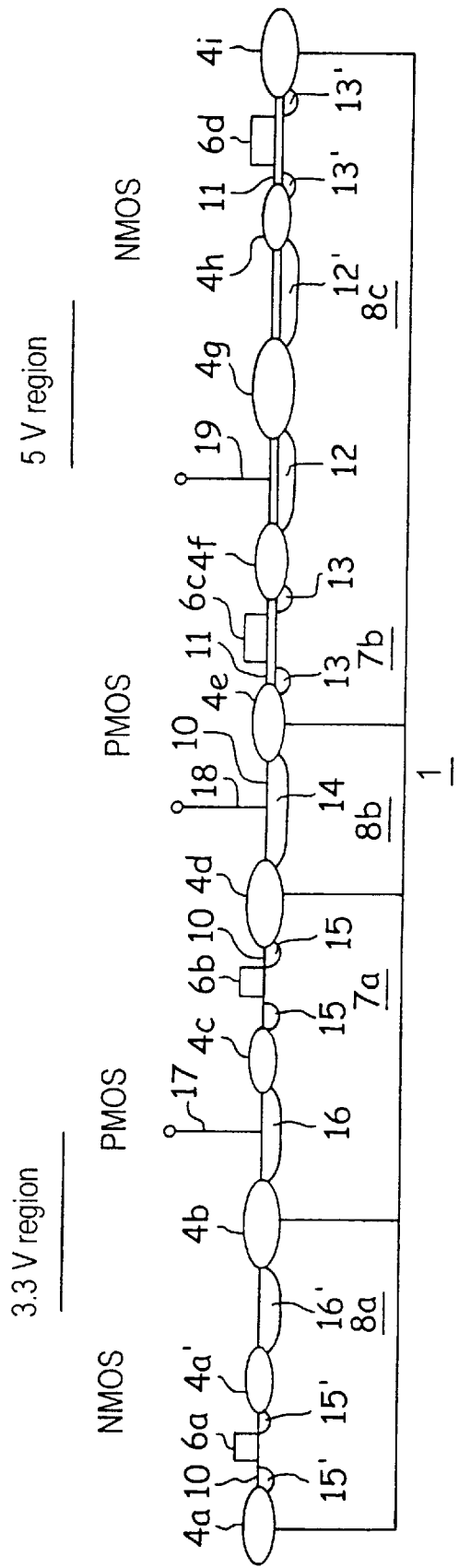

Further, as shown in FIG. 5L, an $N^+$ diffusion layer 16 is formed between the islands 4b and 4c, and an electrode 17 is provided. Similarly, an $N^+$ diffusion layer 12 is formed between the islands 4f and 4g, and an electrode 19 is provided. Further, an $N^+$ diffusion layer 14 is formed between the islands 4d and 4e, and an electrode 18 is provided. Further, though not shown in detail, a protection layer and the like are formed and a metalization process is performed. Thus, a semiconductor integrated circuit having a CMOS structure is produced. FIG. 5M is substantially a combination of FIGS. 5K and 5L, with legends as shown in FIG. 5C.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor device comprising:
    a semiconductor substrate;
    a first complementary MOS transistor formed in said semiconductor substrate, said first complementary MOS transistor being driven under a first power supply voltage;
    a second complementary MOS transistor formed in said semiconductor substrate, said second complementary MOS transistor being driven under a second power supply voltage higher than the first power supply voltage; and
    a well formed between said first and second complementary MOS transistors in said semiconductor substrate, said well being fixed to a prescribed voltage.

2. The device according to claim 1, wherein thicknesses of gate oxide films of P-channel and N-channel MOS transistors in said second complementary MOS transistor are larger than those of gate oxide films of P-channel and N-channel MOS transistors in said first complementary MOS transistor, and gate lengths of the P-channel and N-channel MOS transistors in said second complementary MOS transistor are longer than those of the P-channel and N-channel MOS transistors in said first complementary MOS transistor.

3. The semiconductor device according to claim 2, wherein the first voltage is 3.3 volts, the second voltage is 5 volts, and said well is fixed to a ground potential.

4. The semiconductor device according to claims 1, wherein P-channel and N-channel MOS transistors in said first complementary MOS transistor are formed in first and second wells having different conduction types from each other, and P-channel and N-channel MOS transistors in said second complementary MOS transistor are formed in third and fourth wells having different conduction types from each other.

5. The device according to claim 4, wherein thicknesses of gate oxide films of P-channel and N-channel MOS transistors in said second complementary MOS transistor are larger than those of gate oxide films of P-channel and N-channel MOS transistors in said first complementary MOS transistor, and gate lengths of the P-channel and N-channel MOS transistors in said second complementary MOS transistor are longer than those of the P-channel and N-channel MOS transistors in said first complementary MOS transistor.

6. The device according to claim 4, wherein the first voltage is 3.3 volts, the second voltage is 5 volts, and said well is fixed to a ground potential.

7. A method for fabricating a semiconductor device comprising the steps of:
    forming a plurality of islands in a semiconductor substrate for defining first to fifth regions successively in the semiconductor substrate;
    injecting first ions into the second and fourth regions to form second and fourth wells having a first conduction type;
    injecting second ions different from the first ions into the first, third and fifth regions to form first, third and fifth wells;

injecting further ions into the first and second regions so as to make a threshold voltage of MOS transistors to be formed in the first and second regions the same as those of MOS transistors to be formed in the fourth and fifth regions;

forming a first complementary MOS transistor in the first and second wells;

forming an electrode in the third well to be fixed to a ground potential; and forming a second complementary MOS transistor in the fourth and fifth wells to which a power supply voltage higher than that of the first complementary MOS transistor is applied.

8. The method according to claim 7, wherein in the step of forming the second complementary MOS transistor, thicknesses of gate oxide films of P-channel and N-channel MOS transistors in said second complementary MOS transistor are formed to be larger than those of gate oxide films of P-channel and N-channel MOS transistors in said first complementary MOS transistor, and gate lengths of the P-channel and N-channel MOS transistors in said second complementary MOS transistor are formed to be longer than those of the P-channel and N-channel MOS transistors in said first complementary MOS transistor.

9. The method according to claim 8, wherein the steps of forming the first and second complementary MOS transistors comprises the steps of:

oxidizing all active areas at the same time to form oxide films;

covering the active areas of a resist pattern of the fourth and fifth areas with a resist pattern;

removing the oxide films only at the first, second and third wells by using the resist pattern as a mask; and oxidizing all active areas at the same time to form oxide films, so that thicknesses of the oxide films at the active areas of the fourth and fifth regions are larger than those of the oxide films at the active areas of the first and second regions.

\* \* \* \* \*